United States Patent
Lakshmanan et al.

(10) Patent No.: US 9,843,287 B2
(45) Date of Patent: Dec. 12, 2017

(54) DUAL-STAGE PARABOLIC CONCENTRATOR

(71) Applicants: Karthigueyane Lakshmanan, Chennai (IN); Rajaganapathy Lakshmanan, Karaikal (IN)

(72) Inventors: Karthigueyane Lakshmanan, Chennai (IN); Rajaganapathy Lakshmanan, Karaikal (IN)

( * ) Notice: Subject to any disclaimer, the term of this patent is extended or adjusted under 35 U.S.C. 154(b) by 0 days.

(21) Appl. No.: 15/307,340

(22) PCT Filed: Aug. 14, 2015

(86) PCT No.: PCT/IB2015/056204
§ 371 (c)(1),
(2) Date: Oct. 27, 2016

(87) PCT Pub. No.: WO2015/193870
PCT Pub. Date: Dec. 23, 2015

(65) Prior Publication Data
US 2017/0054408 A1    Feb. 23, 2017

(51) Int. Cl.
*H01L 31/0232* (2014.01)
*H02S 40/22* (2014.01)
*H02S 40/44* (2014.01)
*H01L 31/054* (2014.01)
*H02S 20/32* (2014.01)
*F24J 2/05* (2006.01)
(Continued)

(52) U.S. Cl.
CPC .............. *H02S 40/22* (2014.12); *F24J 2/055* (2013.01); *F24J 2/10* (2013.01); *F24J 2/14* (2013.01); *F24J 2/18* (2013.01); *H01L 31/0547* (2014.12); *H02S 20/32* (2014.12); *H02S 40/44* (2014.12); *F24J 2/50* (2013.01); *F24J 2002/502* (2013.01); *H02S 10/30* (2014.12); *Y02E 10/52* (2013.01); *Y02E 10/60* (2013.01)

(58) Field of Classification Search
CPC .......... F24J 2/12; F24J 2/14; F24J 2/18; F24J 2/5403
USPC ........................................................ 136/246
See application file for complete search history.

(56) References Cited

U.S. PATENT DOCUMENTS 7,435,898 B2 * 10/2008 Shifman .................... F24J 2/12
136/246
7,642,450 B2 * 1/2010 Connor .................... F24J 2/085
126/573

(Continued)

*Primary Examiner* — Jayne Mershon
(74) *Attorney, Agent, or Firm* — Leber IP Law; Celia H. Leber

(57) ABSTRACT

An improvised Solar Concentrator and Absorber/Receiver Subsystem using a Dual-Stage Parabolic Concentrator for Concentrating Solar Power (CSP) (Thermal) system comprises of two parabolic mirrored reflectors wherein their apertures face each other with their focal point/line and axes coincides with each other, a plurality of absorber tubes/cavities placed on the non-reflecting side of the primary and/or secondary reflectors to carry heat transfer fluid, combined with relevant mechanisms to prevent/minimize thermal loss, mounted on a Sun tracking mechanism. For Concentrating Photovoltaic (CPV) and Concentrating Hybrid Thermo-Photovoltaic (CHTPV) Systems, all or a portion of the reflectors' reflecting and/or exterior surfaces would be covered or substituted with suitable photovoltaic panels.

11 Claims, 2 Drawing Sheets

(51) Int. Cl.
*F24J 2/10* (2006.01)
*F24J 2/14* (2006.01)
*F24J 2/18* (2006.01)
H02S 10/30 (2014.01)
*F24J 2/50* (2006.01)

(56) References Cited

U.S. PATENT DOCUMENTS

| | | | | |
|---|---|---|---|---|
| 8,430,093 B1* | 4/2013 | Harris | ............... | F24J 2/12 |
| | | | | 126/683 |
| 8,604,404 B1* | 12/2013 | Linderman | ......... | H01L 31/0525 |
| | | | | 136/246 |
| 2010/0326426 A1* | 12/2010 | Gonzalez Moreno | ..... | F24J 2/12 |
| | | | | 126/600 |
| 2011/0000522 A1* | 1/2011 | Bender | ............ | F24J 2/4638 |
| | | | | 136/246 |
| 2015/0222223 A1* | 8/2015 | Van De Wall | ......... | F24J 2/1057 |
| | | | | 136/251 |

* cited by examiner

DUAL-STAGE PARABOLIC CONCENTRATOR

FIELD OF THE INVENTION

The present invention relates to the field of power generation systems. The present invention specifically relates to a system to convert energy from solar radiation into a concentrated beam of light which in turn is converted into other forms of usable energy such as heat, mechanical work and/or electricity. In particular, this invention portrays a way to enhance efficiency of Concentrating Solar Power (Thermal and Photovoltaic) systems by using Dual-Stage Parabolic Concentrators in a specific configuration or arrangement.

BACKGROUND OF THE INVENTION

Solar energy is one of the popular and well known renewable source to produce clean energy. At present there are various means and methods to convert energy from solar radiation into other usable forms of energy such as heat, mechanical work and/or electricity. Majority of such systems are basically designed using Photovoltaic (PV), Concentrating Solar Power (CSP) (Thermal), Concentrating Photovoltaic (CPV) or Concentrating Hybrid Thermo-Photovoltaic (CHTPV) systems. Since the present invention relates to the CSP, CPV and CHTPV class of systems, some of the existing patents in the same field of invention are listed below as reference:

| Patent Application/ Publication No. | Inventor(s) | Date of Publication |
|---|---|---|
| PCT/IL00/00372 WO 01/02780 A1 | Avi Brenmiller, Menashe Barkai, Eli Mandelberg | 11-Jan-2001 |
| PCT/IT02/00360 WO 02/103256 A1 | Mauro Giuseppe Gianuzzi, Adio Meliozzi, Ettore Diego Prischich, Carlo Rubbia, Mauro Vignoli | 27-Dec-2002 |
| U.S. Pat. No. 13/422,353 US 2012/0312017 A1 | Paul Fraser, Terry Smith, Rocco Luongo, Justin Thurgood, Trent Wetherbee, Raphael Milleret, Allen Peterson, John Edward Augenblick, Scott McCallum, Ian Williford, Ray Erbeznik, Ben Gyori, Patrick Fox, Harry McVicker, Tina Dale | 13-Dec-2012 |
| U.S. Pat. No. 11/381,999 U.S. Pat. No. 7,851,693 B2 | David K. Fork, Stephen J. Horne | 14-Dec-2010 |

A typical CSP system consists of one or more mirrored reflectors that concentrates solar radiation towards an absorber/receiver which produces an intense heat energy. A Heat Transfer Fluid (HTF) is made to circulate through the absorber/receiver to absorb this intense heat energy. The heat energy thus absorbed is used directly to operate a heat driven engine or to produce pressurized steam to power a steam turbine which in turn drives an electric generator to produce electricity. A Sun tracking mechanism is used to follow the movement of Sun throughout the day. Thermal Energy Storage (TES) is optionally used to store excess heat energy collected during day time to produce electricity when direct sunlight is not available. Fossil and/or bio fuel powered systems are optionally integrated with CSP systems in a backup/hybrid mode to extend the duration of energy production in the absence of direct sunlight.

Based on the technology used, CSP systems can be categorized into four types namely Parabolic Trough, Linear Fresnel, Power Tower and Parabolic Dish/Engine. All of these technologies works based on the same basic principle described above.

Though various types of CSP systems are in research and/or commercial use in various parts of the world, major limitations and/or concerns regarding wider usage of such systems are higher cost, huge space requirement, lower conversion efficiency, etc. The following table presents typical operating/evaluating parameters for some of the existing CSP systems[1].

| Type of CSP System | Operating Pressure/ Temperature | | Solar to Electrical Conversion Efficiency | |
|---|---|---|---|---|
| | HTF | Steam | Ideal/ Typical | Average Annual |
| Parabolic Trough | 390° C. | 100 bar at 370° C. | 25%-26% | 13%-15% |
| Power Tower | 565° C. | 100-150 bar at 540° C. | 20%-24% | 14%-18% |
| Dish/Engine | -NA- | -NA- | 31.4% (max) | <20% |

A typical CPV system consists of concentrating optics (mirrors or lenses) made out of inexpensive materials such as glass, steel and plastic to focus sunlight onto a relatively small semiconductor area of interconnected high efficiency silicon or multi-junction (MJ) PV cells. The PV cells are capable of converting sunlight directly into direct-current (DC) electricity. This DC electricity can be used directly, stored in a battery and/or converted to alternating-current (AC) electricity for general usage. Unlike regular PV systems, CPV systems require continuous tracking of Sun throughout the day in order to maintain the concentration of sunlight on the cell. This system offers a higher solar to electric conversion efficiency using MJ PV cells (up to 43% under laboratory conditions), but at a higher cost due to the cost of manufacturing of high efficiency MJ PV cells and the complexity of tracking subsystem[2].

A typical CHTPV system is a variation of CPV system that incorporates additional mechanism for thermal energy extraction from the heat generated by PV cells in a way similar to CSP systems.

Therefore, primary object of the present invention is to improve the solar to electrical conversion efficiency of the CSP, CPV and CHTPV class of systems which in turn may reduce the cost and space requirements of such systems.

SUMMARY OF THE INVENTION

When it comes to improving efficiency of a CSP, CPV or CHTPV system, it can be done by improving the efficiency of one or more of the various subsystems involved such as concentrator, absorber/receiver, Sun tracking mechanism, heat transfer fluid, thermal energy storage, heat engine/steam turbine, electricity generator, photovoltaic cells, etc. The present invention attempts to improve the efficiency of the concentrator and absorber/receiver subsystem.

A basic convention being followed in designing solar concentrators with multistage reflectors is to avoid reentry of a ray in any of the stages. However, the concentrator design proposed in this invention violates this convention in an effort to achieve a higher conversion efficiency. Another key area to be improved in existing CSP systems is the efficiency of absorbers/receivers. Since the absorptivity of the absorber's surface cannot be 100% and as the speed of light is much higher than the rate at which heat is transferred through the absorber's/receiver's surface, existing absorber/receiver designs loses a considerable portion of the energy directed towards it. The same case applies for PV based systems too. To overcome this, the present invention allows for a slow, gradual and complete absorption of heat and/or light energy from the concentrated beam of sunlight.

The present invention of a Dual-Stage Parabolic Concentrator for CSP systems in its simplest configuration comprises of two parabolic mirrored reflectors wherein their apertures face each other with their focal point/line and axes coincides with each other, a plurality of absorber tubes/cavities placed on the non-reflecting side of the primary and/or secondary reflectors to carry heat transfer fluid, combined with relevant mechanisms to prevent/minimize thermal loss, mounted on a Sun tracking mechanism.

For CPV systems, all or a portion of the primary and/or secondary reflector's reflecting and/or exterior surfaces would be covered or substituted with suitable photovoltaic panels to convert light energy directly to electrical energy.

For CHTPV systems, apart from direct conversion of light energy to electrical energy using photovoltaic panels, heat energy generated by them would be absorbed in a way similar to CSP systems. This improves the overall system efficiency.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Referring now to the drawings wherein the showings are for the purpose of illustrating a preferred embodiment of the invention only, and not for the purpose of limiting the same. For the sake of clarity and simplicity, the parts are not drawn to scale and proportion. Like parts are named/numbered the same in all diagrams for easy referencing and readability.

DETAILED DESCRIPTION OF THE INVENTION

Figure 1:
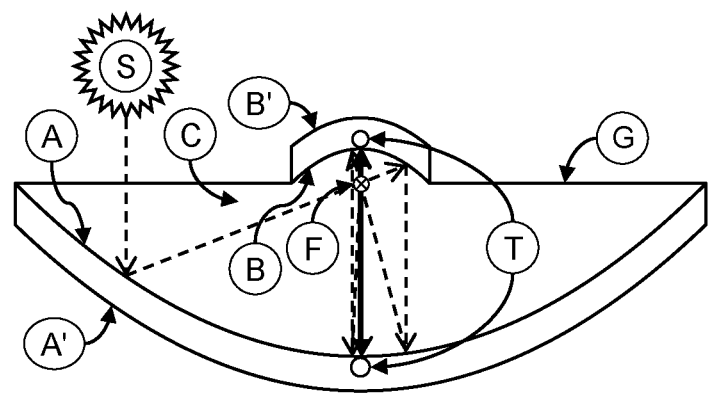
FIG. 1 shows a schematic diagram of Dual-Stage Parabolic Concentrator with a Primary (A) and Secondary (B) Reflector having Absorber Tubes (T) for carrying heat transfer fluid attached to their vertices on the non-reflecting side which are held within a cavity with appropriate thermal insulation having primary (A') and secondary (B') exterior surfaces to prevent/minimize thermal loss from (A), (B) and (T). Aperture of (A) exposed to direct solar irradiation is covered with a sheet of Single Walled Glass (G) having selective reflective coating for infrared rays on the side that faces the aperture of (A) and anti-reflection coating on the outer side.

Referring to FIG. 1, a simplest schematic diagram of Dual-Stage Parabolic Concentrator is illustrated, to describe the principle behind this design.

Figure 2:
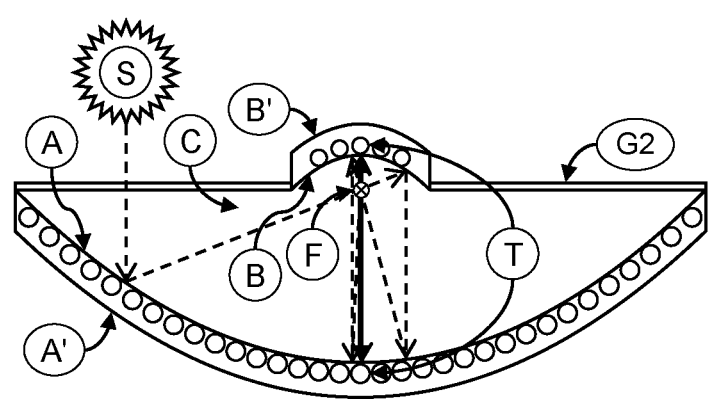
FIG. 2 shows an alternate Schematic Diagram of Dual-Stage Parabolic Concentrator similar to the one shown in FIG. 1, but with Absorber Tubes (T) covering the entire non-reflecting surface of Primary (A) and Secondary (B) Reflectors. Single Walled Glass (G) in FIG. 1 is replaced with a Double Walled Vacuum Sealed Glass (G2).
Figure 3:
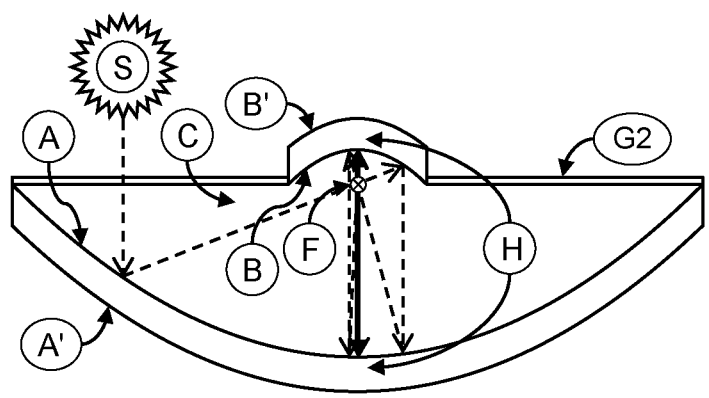
FIG. 3 shows an alternate Schematic Diagram of Dual-Stage Parabolic Concentrator similar to the one shown in FIG. 2, but with Hollow Cavity (H) on the non-reflecting side of Primary (A) and Secondary (B) Reflectors for carrying Heat Transfer Fluid.

The Dual-Stage Parabolic Concentrator proposed in this invention comprises of a larger primary parabolic reflector (A) whose aperture would always face the Sun (S) directly with the help of a Sun tracking mechanism (not shown in figure) and a smaller secondary parabolic reflector (B) whose aperture would face the primary reflector's aperture. These two reflectors would be arranged in a way such that their focal point/line (F) and axes coincides with each other. A plurality of Absorber Tubes (T) for carrying heat transfer fluid would be placed at the vertex (as shown in FIG. 1) and/or throughout the surface of both the reflectors on their external (non-reflecting) side (as shown in FIG. 2). These tubes, along with the non-reflecting surface of the reflectors would be covered/sealed with appropriate thermal insulation (not shown in figure) having primary (A') and secondary (B') exterior surfaces to prevent/minimize thermal loss. The open area of the primary reflector's aperture not covered by the secondary reflector's aperture would be covered by a sheet of single (G) (as shown in FIG. 1) or double (as shown in FIG. 2) walled glass (G2) thus the entire structure would be a closed cavity (C) which can be vacuum sealed to prevent/minimize thermal loss from the reflective sides of the reflectors. The inner surface of (G) or (G2) will have a selective reflective coating that would reflect infrared rays emitted by the hot reflector surfaces back into the cavity (C) and outer surface of (G) or (G2) will have an anti-reflection coating to minimize reflection losses. If double walled glass (G2) is used, then the gap between the two walls will also be vacuum sealed. The entire setup would be mounted on a Sun tracking mechanism (not shown in figure) to follow the Sun's movement throughout the day and across all seasons.

For CPV and CHTPV systems, all or a portion of the primary parabolic reflector (A) and secondary parabolic reflector (B) around their vertices that receives a concentrated beam of sunlight will be covered or substituted with a suitable panel of PV cells.

Energy irradiated on the area covered by secondary parabolic reflector (B) will be extracted with the help of a suitable panel of PV cells placed over the exterior surface (B') of secondary parabolic reflector (B).

By the basic reflection property of parabolic structures, when a ray directed parallel to the axis of primary parabolic reflector (A) hits its reflective surface, it would get reflected towards the focal point (F). Since there is nothing to intercept the ray at (F), it would travel straight in the same direction and would hit the reflective surface of the secondary reflector (B). Again by the same reflection property of parabolic structures, when a ray originated from the focal point (F) of the secondary parabolic reflector (B) hits its reflective surface, it would get reflected in a direction parallel to the axis of (B) which in turn is parallel to the axis of (A). When this ray hits the reflective surface of (A) again, this process would repeat multiple times and finally would result in a thin, highly coherent and intense beam of light passing through (F) along a line that coincides with the axes of both (A) and (B).

In reality we cannot expect 100% reflectivity for the reflective surfaces used for both (A) and (B). Similarly we cannot expect 100% absorptivity for the Absorption Tubes (T) as well. So, a small portion of energy of every ray that hits both the reflective surfaces is lost as heat energy for every reflection and this heat energy is absorbed by the heat transfer fluid flowing through (T) attached to (A) and (B). This arrangement allows slow, gradual and complete absorption of heat energy from the concentrated beam of sunlight as opposed to the existing designs which allows absorption only by a single hit of the concentrated beam of sunlight at the absorber's surface.

In case of CPV and CHTPV systems, the PV panels on both primary (A) or secondary (B) parabolic surfaces would get a chance to convert light energy from a single ray of light to electrical energy on its every hit through multiple reflections, thus increasing the overall conversion efficiency.

In case of CHTPV systems, in addition to the direct conversion of light energy to electrical energy, the heat energy generated by the PV panels would get extracted by the absorber tubes (T) which further increases the overall conversion efficiency.

Theoretical computation shows that Solar to Thermal Conversion efficiency of such a system would be directly proportional to the reflectivity of (A) and (B). Typical reflectivity of metallic or glass mirrors is between 85% to 95% (in certain cases it can go up to 99%) and hence we can expect more than 80% of the solar irradiation to be absorbed by this improvised solar concentrator thus increasing the overall conversion efficiency of the CSP, CPV and CHTPV systems.

Results from simulated models shows that there is a relationship between the rim angle of primary (A) and secondary (B) parabolic surfaces to get maximum power out of this design. The best possible configuration is to have the rim angle of primary (A) parabolic surface less than 90° and the rim angle of secondary (B) parabolic surface either equal to the rim angle of (A) or greater than or equal to its 180° compliment. For example, if the rim angle of (A) is chosen to be 80°, then to get maximum power output from this design, the rim angle of (B) should be either equal to 80° or greater than or equal to 100° (180°−80°).

While the concept of concentrating sunlight and absorbing light/heat energy from it is understandable, a means and mechanism to hold the concentrated beam of sunlight within a cavity till all the light/heat energy from it is slowly and completely absorbed is the key to this invention.

Figure 4:
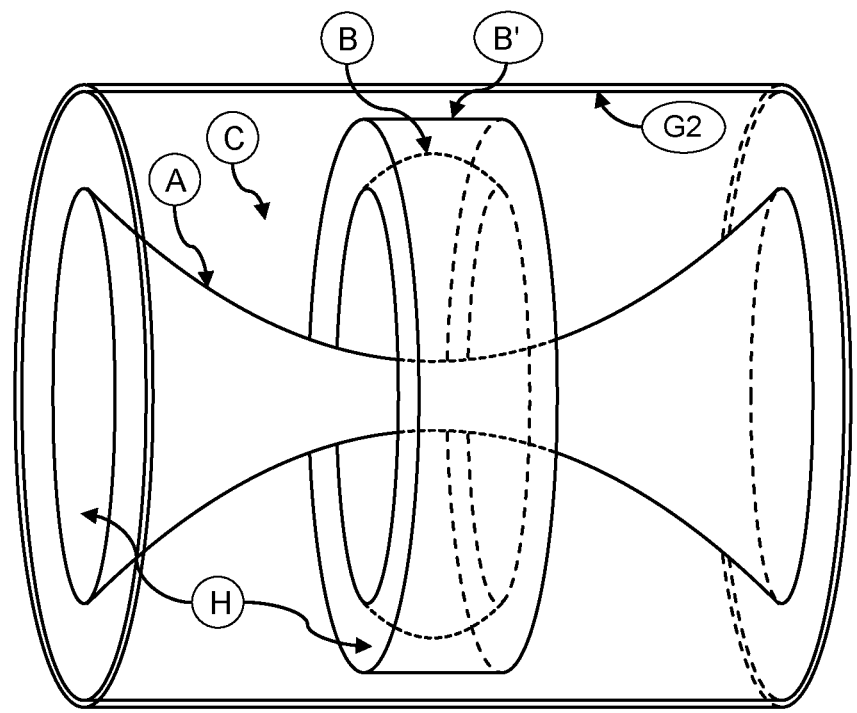
FIG. 4 shows an alternate Schematic Diagram of Dual-Stage Parabolic Concentrator in a Cylindrical Configuration. Hollow Cavity (H) enclosed by the non-reflecting side of Primary (A) and Secondary (B) Reflectors would carry the Heat Transfer Fluid. The entire setup is covered with a Double Walled Glass Tube (G2).

Having described the principle behind this theory using a simplest two dimensional schematic diagram, some of the alterations and modifications to this design are listed as follows:
 i. Linear translation of the schematic diagram along a plane perpendicular to the plane of paper would result in a Dual-stage Parabolic Trough Concentrator.
 ii. Rotational translation of the schematic diagram along the axes of (A) & (B) would result in a Dual-stage Parabolic Dish Concentrator.
 iii. Rotational translation of the schematic diagram along a line below the vertex of (A) and parallel to its directrix would result in a Dual-stage Parabolic Cylindrical Concentrator (as shown in FIG. 4). The key advantage of this configuration is that it doesn't require a Sun tracking mechanism to follow the Sun throughout the day, but it would require a mechanism to follow the seasonal movement of Sun's path between solstices.
 iv. The reflectors (A) and (B) could also take the form of a Fresnel reflector using thin strips/segments of mirrored reflectors.

Apart from using this principle for concentrating Sunlight, in general it could be used for concentrating any electromagnetic wave.

The foregoing description is a specific embodiment of the present invention. It should be appreciated that this embodiment is described for purpose of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described our invention, we claim:

1. A dual-stage parabolic concentrator based solar concentrator and absorber system, the system comprising:
 a reflector subsystem with two parabolic mirrored reflectors—a larger primary reflector and a smaller secondary reflector, wherein apertures of the two reflectors face each other with their focal point and axes coinciding with each other to enable multiple reflections of sunlight hitting the primary reflector finally resulting in a highly coherent and intense sunlight in a narrow region around the coinciding focal points and the coinciding axes of the two reflectors.

2. The system of claim 1, wherein the system further comprises:
 an absorber subsystem comprising a plurality of absorber tubes/cavities placed on the non-reflecting side of one or both of the primary and secondary reflectors; the tubes/cavities configured to circulate heat transfer fluid; and
 a thermal insulation subsystem to prevent/minimize thermal loss.

3. The system of claim 1, wherein the parabolic mirrored reflectors are of a shape selected from parabolic trough and parabolic dish, wherein the system further comprises a sun tracking subsystem configured to follow sun's movement through the day across all seasons.

4. The system of claim 1, wherein the parabolic mirrored reflectors are of cylindrical shape generated by rotational translation of sections of the two parabolic reflectors arranged along a common line below the vertex and parallel to the directrix of the primary reflector; and wherein the system further comprises a mechanism to follow the seasonal movement of sun's path between solstices.

5. The system of claim 1, wherein the reflectors are manufactured using any one or combination of materials selected from glass, metals, polymers, photovoltaic panels or synthetic materials, and wherein the individual reflectors are manufactured as a single piece or a combination of multiple pieces with relevant interlocking mechanism for easy assembly and integration, and wherein thermal insulation is provided between individual pieces for prevention of loss of heat energy by conduction from smaller sections of high temperature zone to larger sections of low temperature zone of the reflectors.

6. The system of claim 2, wherein the absorber subsystem comprises individual absorbers of at least one or a combination of tubular and cavity structure configured to be operatively connected to a non-reflecting side of at least one of the primary reflector and the secondary reflector.

7. The system of claim 2, wherein the thermal insulation subsystem comprises:
 at least one sheet or tube of single or evacuated double walled envelope made of glass enclosing at least one of the reflectors to minimize thermal loss by convection, the envelope having an inner surface and an outer surface;

thermal insulation covering non-reflective parts of the system to minimize thermal loss by conduction; and thermal insulation between multiple pieces of the reflectors to minimize loss of heat energy by conduction across sections of different temperature zones.

8. The system of claim 7, wherein the envelope has at least one of:
(i) a selective reflective coating for infrared rays on its inner surface to minimize thermal loss by infrared radiation from the reflective surface of parabolic reflectors; and
(ii) an anti-reflection coating on its outer surface to minimize reflection losses.

9. The system of claim 7, wherein the gap between two walls of the double walled envelope is vacuum sealed to minimize thermal loss by conduction.

10. The system of claim 1, wherein the system is configured for use with any one or combination of systems selected from a group comprising thermal concentrating solar power (CSP), concentrating photovoltaic (CPV) and concentrating hybrid thermo-photovoltaic (CHTPV) systems.

11. The system of claim 1, wherein the reflectors are in the form of a Fresnel reflector using thin strips or segments of reflectors.

* * * * *